United States Patent [19]

Van Besauw et al.

[11] 4,004,925
[45] Jan. 25, 1977

[54] PRODUCTION OF PHOTOMASKS BY FORMING COMPLEX OF SILVER AND DIAZONIUM OR PYRYLIUM SALTS

[75] Inventors: Jan Frans Van Besauw, Mortsel; Albert Lucien Poot, Kontich, both of Belgium

[73] Assignee: AGFA-GEVAERT N.V., Mortsel, Belgium

[22] Filed: Feb. 18, 1975

[21] Appl. No.: 550,442

[30] Foreign Application Priority Data
Feb. 19, 1974 United Kingdom ............... 7447/74

[52] U.S. Cl. ........................................ 96/58; 96/36; 96/38.3; 96/44; 96/84 R; 96/84 UV
[51] Int. Cl.² ...................... G03C 7/00; G03C 5/00
[58] Field of Search .......... 96/27 R, 27 E, 36, 38.3, 96/44, 58, 84 R, 84 UV

[56] References Cited

UNITED STATES PATENTS

| | | | |
|---|---|---|---|
| 3,506,442 | 4/1970 | Kerwin et al. | 96/44 X |
| 3,567,447 | 3/1971 | Chand | 96/38.3 X |
| 3,639,125 | 2/1972 | Chand | 96/38.3 UX |
| 3,716,363 | 2/1973 | Ruggerio | 96/38.3 X |

*Primary Examiner*—Edward C. Kimlin
*Attorney, Agent, or Firm*—William J. Daniel

[57] ABSTRACT

A photomask comprising a support that is transparent to ultra-violet radiation and visible light and a layer incorporating a photomask image, the image parts of which contain a complex compound of a silver halide and a diazonium, pyrylium, or thiapyrylium salt, wherein said complex compound is substantially opaque to ultra-violet radiation and blue light but substantially transmitting visible light in the wavelength range above 500 nm.

14 Claims, No Drawings

PRODUCTION OF PHOTOMASKS BY FORMING COMPLEX OF SILVER AND DIAZONIUM OR PYRYLIUM SALTS

The present invention relates to a process for the production of photomasks and to photomasks obtained by said process.

In the published German Patent Application (DOS) 2,201,700 a process for the production of a photomask by means of a photographic silver halide material is described. The photomask consists of a transparent support carrying a colloid layer comprising a mask image, the image parts of which are non-transparent to ultra-violet radiation and blue light but transmit visible light of wavelengths above 500 nm.

The production of such a photomask having in the image parts a specific transmittance of visible light is particularly valuable in view of the precise visual registration of the photomask with a relief pattern already obtained e.g. on an integrated circuit semi-conductor device being manufactured.

A visual registration is particularly difficult when the photomask contains the usual black silver image parts that do not transmit visible light. Since the common photoresist polymer compositions are mainly sensitive to ultraviolet radiation (e.g. of a wavelength range of 275 to 425 nm), there is no special need for a black photomask image that absorbs ultra-violet radiation and the light of the whole visible spectrum.

Therefore, in view of offering registration facilities, photomasks have been produced having image parts that selectively absorb U.V. radiation and blue light and that transmit visible light within a wavelength range above 500 nm.

For that purpose a photographic silver halide material is described in said published German Patent Application, an image of a complex of silver and a heterocyclic ammonium salt complex being produced in said material. Said image is particularly opaque to ultra-violet radiation and blue light but transmits substantially visible light of a wavelength range above 500 nm.

According to one embodiment of said process, called negative-positive process, a developed and fixed silver metal image is first converted by oxidation with e.g. potassium cyanoferrate (III) and potassium bromide into a water-insoluble silver salt image.

In a second step the silver bromide image obtained is converted into said complex by reaction of the silver bromide with the heterocyclic ammonium salt. Said embodiment offers negative masks with respect to positive originals.

According to another embodiment of said process, called positive-positive process a light-sensitive silver halide material is exposed image-wise to produce a silver image that is negative in respect of the original. In the exposed parts a silver metal image is developed and in the non-exposed parts an unaffected silver halide image is left, which image is positive in respect of the original. This silver halide image is treated with said heterocyclic ammonium salt and converted into the minus-blue light-transmitting complex. The remaining silver image is removed then from the photographic material by a commonly known bleach and fixing processing.

According to the working examples of said published German Patent Application the conversion of the silver halide into said complex lasts from 3 to 5 minutes at 20° C, depending on the type of heterocyclic ammonium salt used.

It has been found now that diazonium salts, pyrylium salts, and thiapyrylium salts form likewise minus-blue visible light-transparent photomask images as the above heterocyclic ammonium salts. According to the present invention the conversion of the silver halide into a coloured silver complex is possible within less than 3 minutes at room temperature (20° C).

The photomask according to the present invention comprises a support that is transparent to ultra-violet radiation and visible light and a layer incorporating a photomask image, the image parts of which contain a complex compound of a silver halide and a diazonium, pyrylium, or thiapyrylium salt, the complex compound being substantially opaque to ultraviolet radiation and blue light but substantially transmitting visible light in the wavelength range above 500 nm.

The photomask according to the present invention is obtained by treating a photographic material, which contains in image-wise distribution a water-insoluble silver salt, with an aqueous solution containing at least one salt of the group consisting of a diazonium salt, a pyrylium salt, and a thiapyrylium salt.

According to the "negative-positive" process an image-wise exposed, developed, and fixed (the non-exposed silver halide has been removed) silver halide emulsion layer is treated with an oxidizing solution converting the resulting silver image again into a water-insoluble silver salt e.g. with an aqueous oxidizing solution containing cyanoferrate(III) ions and bromide ions. By the latter reactants the silver is rehalogenated according to the following reaction scheme:

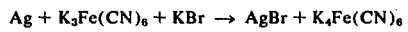

$$Ag + K_3Fe(CN)_6 + KBr \rightarrow AgBr + K_4Fe(CN)_6$$

The water-insoluble silver salt obtained is then treated with an aqueous solution containing the diazonium salt preferably in the presence of hydronium ions and iodide ions or with an aqueous solution containing the pyrylium and/or thiapyrylium salt preferably in the presence of a water-miscible organic solvent such as dimethylformamide, improving the solubility of said salt.

By the wording "water-insoluble silver salt" is meant a silver salt, whose solubility in water at 20° C is below about $9.10^{-4}$ g per 100 ml of water. Preferred water-insoluble silver salts for forming said complex are silver halides of the chloride, bromide, or iodide type or mixtures thereof. The silver halide grains are preferably dispersed in a hydrophilic colloid as binder.

According to the positive-positive process a light-sensitive silver halide material is image-wise exposed and developed to yield a silver metal image, which is a negative in respect of the original. In the non-exposed parts the silver halide left is treated with the diazonium salt, pyrylium, and/or thiapyrylium salt thus forming a coloured complex with the silver halide. Without deterioration of the coloured complex image the remaining metal silver image is then removed in a common way by bleaching (oxidation) and fixing (e.g. thiosulphate complexing action) and rinsing.

According to another positive-positive process, which actually is based on the common black-and-white "reversal" process a light-sensitive silver halide material is image-wise exposed and developed to yield a silver image which is negative in respect of the original, the resulting silver image is re-oxidized e.g. with dichromate ions to form a non-photo-sensitive silver salt. The thus treated material is overall exposed to actinic light, to which the remaining silver halide is sensitive, redeveloped, and fixed. The silver image obtained is bleached and re-halogenated thereby. The re-halogenated silver image is treated to form a coloured complex image with said diazonium salt, pyrylium, and/or thiapyrylium salt.

line. Preference is given to the diazonium salts derived from p-phenylenediamine that is mono- or dialkyl substituted on one of its amino groups or of which one of the amino groups makes part of a saturated heterocyclic ring e.g. a morpholine ring.

Diazonium salts that are particularly useful for the purpose of the present invention are listed in the following table 1.

Table 1

| No. | $R_1$ | $R_2$ | $R_3$ | n | $X^-$ |
|---|---|---|---|---|---|
| 1 | $(CH_3)_2N-$ | H | H | ½ | $\frac{ZnCl_4}{2}$ |
| 2 | $C_6H_5NH-$ | H | H | 1 | $HSO_4$ |
| 3 | morpholino | H | H | ½ | $\frac{ZnCl_4}{2}$ |
| 4 | $(C_2H_5)_2N-$ | H | H | 1 | $BF_4$ |
| 5 | morpholino | $2-CH_3O-$ | $6-CH_3O-$ | ½ | $\frac{ZnCl_4}{2}$ |
| 6 | morpholino | $2-CH_3O-$ | $6-CH_3O-$ | 1 | $ZnCl_3$ |
| 7 | $HOCH_2CH_2(C_2H_5)N-$ | H | H | ½ | $\frac{ZnCl_4}{2}$ |
| 8 | $(C_2H_5)_2N-$ | H | H | 1 | $ZnCl_3$ |
| 9 | $(CH_3)_2N-$ | H | H | 1 | $BF_4$ |
| 10 | $C_2H_5O-C_6H_4-$ | $2-C_2H_5O-$ | $6-C_2H_5O-$ | ½ | $\frac{(COO)_2}{2}$ |

Diazonium salts that are illustrative of the type suitable for practising the invention are derived e.g. from p-diamines of the benzene series or from a p-arylani- A pyrylium salt and thiapyrylium salts that are particularly useful for the purpose of the present invention are listed in the following table 2.

Table 2

| No. | $R_1$ | $R_2$ | $R_3$ | $R_4$ | $R_5$ | $X^+$ | $Y^-$ |
|---|---|---|---|---|---|---|---|
| 1 | morpholino | phenyl | H | H | phenyl | S | $ClO_4$ |

Table 2-continued

| No. | $R_1$ | $R_2$ | $R_3$ | $R_4$ | $R_5$ | $X^+$ | $Y^-$ |
|-----|-------|-------|-------|-------|-------|-------|-------|
| 2 | —N⟨⟩ (piperidino) | —⟨phenyl⟩ | H | H | —⟨phenyl⟩ | S | $ClO_4$ |
| 3 | —N⟨⟩ (piperidino) | —⟨phenyl⟩ | H | H | —⟨phenyl⟩—$CH_3$ | S | $ClO_4$ |
| 4 | —$CH_3$ | H | —$CH_3$ | H H H H<br>—C=C—C=C— | | O | Cl |

The diazonium compounds are prepared by diazotation of the corresponding primary amines according to a technique known to those skilled in the chemical art.

The pyrylium salts, also called "pyroxonium salts", can be prepared according to J.Pr.Ch. 313 (6) (1971) p.1113–7.

The thiapyrylium salts can be prepared according to J.Nauk.Prikl.Phot.Kh. 9 (1964) p.209–10.

In the described complex formation diazonium salts are preferably used in an aqueous solution in a concentration of about $10^{-2}$ to about $10^{-1}$ mole per liter.

The pyrylium and thiapyrylium salts are preferably used in dissolved form in a mixture of water and a water-miscible organic solvent e.g. dimethylformamide in a salt concentration of about $10^{-4}$ to about $10^{-2}$ mole per liter.

The re-oxidation of the silver image in the "negative-positive" process is preferably carried out with an alkaline cyanoferrate(III) e.g. potassium cyanoferrate(III) in a concentration of 2 to 10% by weight in water in the presence of an alkaline bromide e.g. potassium bromide in a concentration of 1 to 7% by weight.

The cyanoferrate(III) can be wholly or partly replaced by potassium dichromate as is used in a tanning bleach (see the book of P. Glafkidès, Photographic Chemistry Vol. II Fountain Press London (1960), p.666).

A suitable bleaching-fixing bath for use in the above-described "positive-positive" process contains thiosulphate ions, bromide ions, and cyanoferrate(III) ions (see the above-mentioned book on p. 633).

To determine whether a particular diazonium, pyrylium, or thiapyrylium salt forms or does not form a coloured complex with sufficient opacity below 500 nm and sufficient transmittance above 500 nm, an unexposed silver bromide emulsion layer can be subjected to a treatment with the solution containing the salt to be tested. After drying of the treated layer its spectral absorption characteristics are determined with a densitometer using an ultra-violet radiation source and an appropriate filter e.g. a cut-off filter transmitting the visible light above 500 nm.

The photographic silver halide materials used in combination with the above treating liquids for the production of photomasks preferably contain a fine-grain silver halide emulsion layer comprising silver bromide-iodide grains having a maximum content of 10 mole % of silver iodide. The grain size is preferably below 0.1 micron e.g. about 0.05 micron. Preference is given to emulsion layers that when exposed in contact with a line screen have a resolution of at least 560 lines per mm.

The spectral sensitivity of the silver halide emulsions can be increased or improved by spectral sensitization with common spectrally sensitizing dyes used in silver halide emulsions, which include cyanine dyes and merocyanine dyes as well as other dyes as described by F.M. Hamer in "The cyanine dyes and related compounds", Interscience Publishers (1964). These dyes are preferably used in an amount of 20 mg to 250 mg per mole of silver halide.

The image-forming silver halide emulsion can be sensitized chemically by any of the known procedures. The emulsions can be digested with naturally active gelatin or with small amounts of sulphur-containing compounds such as allyl thiocyanate, allylthiourea, sodium thiosulphate, etc. The image-forming emulsion can be sensitized likewise by means of reductors, e.g. tin compounds as described in the United Kingdom patent specification No. 789,823, polyamines e.g. diethyltriamine, and small amounts of noble metal compounds such as of gold, platinum, palladium, iridium, ruthenium, and rhodium as described by R. Koslowsky, Z.Wiss.Phot. 46, 67–72 (1951). Representative examples of noble metal compounds are ammonium chloropalladate, potassium chloroplatinate, potassium chloroaurate, and potassium aurithiocyanate.

Emulsion stabilizers and antifoggants can be added to the silver halide emulsion, e.g., the known sulphinic and selenic acids or salts thereof, aliphatic, aromatic or heterocyclic mercapto compounds or disulphides, e.g. those described in the published German Patent Application 2,100,622, preferably comprising sulpho groups or carboxyl groups, mercury compounds e.g. those described in the Belgian Patent Specifications 524,121 — 677,337 — 707,386, and 709,195 and tetraazaindenes as described by Birr in Z.Wiss.Phot. 47, 2–58 (1952), e.g. the hydroxy-tetraazaindenes of the following general formula:

$$\begin{array}{c} \text{OH} \\ | \\ \text{C} \\ R_3-C \diagup \diagdown N \diagup N \diagdown \\ | \quad | \quad C-R_1 \\ R_2-C \diagdown \diagup C = N \\ N \end{array}$$

wherein:
each of $R_1$ and $R_2$ represents hydrogen, an alkyl group, an aralkyl group, or an aryl group, and
$R_3$ represents hydrogen, an alkyl group, a carboxy group, or an alkoxycarbonyl group, such as 5-methyl-7-hydroxy-s-triazolo[1,5-a]-pyrimidine.

Other additives can be incorporated into one or more of the hydrophilic colloid layers of the radiation-sensitive silver halide elements, e.g. hardening agents such as formaldehyde, dialdehydes, hydroxy-aldehydes, mucochloric and mucobromic acid, acrolein, and glyoxal.

The photoplates such as the Agfa-Gevaert Micromask (reg. trade name) plate are particularly suited for the process of the present invention, the resolving power exceeding 5,000 lines per inch. The Micromask plates are supplied with glass supports in two types of glass: "selected flat glass" with a flatness tolerance of 0.001 inch/linear inch and "ultra-flat glass" with a flatness tolerance of 0.0002 inch per linear inch.

The development is preferably carried out in a high resolution plate developer containing hydroquinone and having a pH of about 10.8.

The photomasks prepared according to the present invention are particularly useful in positional registration when more than one mask is required. It is known that the average integrated circuit may require ten or more masks. The present photomasks are, however, not only useful in the preparation of microelectronic devices including microelectronic circuitry, but also in the manufacture of common printed circuits and precision mechanical art work to be produced by etching and/or electroplating.

The present invention includes the following examples without, however, limiting it thereto.

EXAMPLE 1

A photographic micro-fine-grain silver halide emulsion material, which comprises a gelatino-silver bromo-iodide emulsion layer having silver halide grains of a mean grain size of 0.068 micron and applied to an ultra-flat glass support, was exposed through a microprint original and developed and fixed in the usual way.

The silver image obtained had an optical density of 2.3 to 2.5.

The silver image was bleached with the following bleaching solution:

| | |
|---|---|
| potassium cyanoferrate(III) | 60 g |
| potassium bromide | 60 g |
| water | 1000 ml |

The bleaching lasted 2 minutes at 20° to 25° C.
The bleached plate was rinsed for about 30 sec with water.

The thus treated material was dipped for 30 sec to 2 min at 20° C into the following solution forming a coloured silver complex:

| | |
|---|---|
| citric acid | 100 g |
| a diazonium salt of Table 1 | $2.10^{-2}$ mole |
| potassium iodide | 10 g |
| water | 1000 ml |

The plate was then rinsed for 30 sec in water.
The coloured image parts corresponding with the originally black silver image parts had an optical density of more than 3 for short wavelength light up to 425 nm and an optical density of more than 2 up to 460 nm. The print obtained was a coloured negative of the micro-print original.

EXAMPLE 2

A photographic material as described in Example 1 was exposed through a micro-print original, developed in the usual way, and rinsed for 20 sec at 20° C in water.

The rinsed material was treated for 30 sec to 2 min with a solution containing a diazonium salt as described in Example 1. The thus treated photographic material was black in the exposed parts and coloured in the non-exposed areas.

The colour was yellow, yellow-green, green or orange-green depending on the structure of the diazonium compound used.

The material was rinsed, whereupon the silver image was bleached as described in Example 1 and fixed with a fixing solution containing sodium thiosulphate.

Finally, a positive coloured copy of the microprint original was obtained.

EXAMPLE 3

A photographic micro-fine-grain silver halide emulsion material as described in Example 1 was exposed and developed in the usual way.

The obtained silver image was bleached with an acidic potassium dichromate solution and thereupon treated with a sodium hydrogen sulphite solution.

Subsequently, the thus treated material was overall exposed to actinic light, to which the remaining silver halide is sensitive, redeveloped and fixed.

In this way a positive black silver image with an optical density of about 2.5 (measured through a "visual" filter with a Macbeth Quantalog TD 102 (trade name) densitometer) was obtained. A "visual" filter is a filter transmitting only visible light.

The thus obtained silver image was bleached as described in Example 1 and treated for 30 sec to 2 min with a solution containing a diazonium salt as described in Example 1.

A transparent yellow to orange coloured micro-copy of the micro-print original was obtained.

EXAMPLES 4–6

The Examples 1 to 3 were repeated with the difference, however, that the treating solution for obtaining a coloured silver complex image had the following composition:

| | |
|---|---|
| pyrylium or thiapyrylium compound of Table 2 | $10^{-3}$ mole |
| dimethylformamide | 100 ml |
| water | 900 ml |

We claim:

1. A photomask comprising a support that is transparent to ultra-violet radiation and visible light and a layer incorporating a photomask image, the image parts of which contain a complex compound of a silver halide and a diazonium, pyrylium, or thiapyrylium salt, wherein said complex compound is substantially opaque to ultra-violet radiation an blue light but substantially transmitting visible light in the wavelength range above 500 nm.

2. A photomask according to claim 1, wherein the diazonium salt is derived from a p-diamine of the benzene series or from a p-arylaniline.

3. A photomask according to claim 1, wherein the diazonium salt is derived from p-phenylenediamine that is mono- or dialkyl substituted on one of its amino groups or of which one of the amino groups makes part of a saturated heterocyclic ring.

4. A process for the preparation of a photomask image that is substantially opaque to ultraviolet radiation and blue light but substantially transmitting of visible light in the wave length range above about 500 nm by treating a photographic material, which contains in image-wise distribution a water-insoluble silver salt with an aqueous solution containing at least one salt of the group consisting of a diazonium salt, a pyrylium salt, and a thiapyrylium salt, whereby a complex is formed which is substantially opaque to ultraviolet and blue light and is substantially transparent to visible light of a wave length above about 500 nm.

5. A process according to claim 4, wherein said silver salt is a photosensitive silver halide salt.

6. A process according to claim 4, wherein an image-wise exposed, developed and fixed silver halide emulsion layer is treated with an oxidizing solution converting the resulting silver image into a water-insoluble silver salt and wherein the thus treated material is treated with said diazonium salt, pyrylium salt, and/or thiapyrylium salt.

7. A process according to claim 6, wherein the diazonium salt is used in an aqueous solution in the presence of hydronium and iodide ions.

8. A process according to claim 6, wherein the pyrylium and/or thiapyrylium salt is used in the presence of a water-miscible organic solvent improving the solubility of said salt in aqueous medium.

9. A process according to claim 4, wherein a light-sensitive silver halide material is image-wise exposed and developed to yield a silver metal image, which is a negative with respect to the original, and the silver halide left in the non-exposed parts is treated with the diazonium salt, pyrylium salt and/or thiapyrylium salt, forming thereby a coloured complex with the silver halide and wherein the silver metal image is removed without deterioration of the coloured complex image by bleaching, fixing, and rinsing of the photographic material.

10. A process according to claim 4, wherein a light-sensitive silver halide material is image-wise exposed and developed to yield a silver image that is a negative with respect to the original, which silver image is then re-oxidized to form a non-photo-sensitive silver salt, the thus treated material is overall exposed to actinic light, to which the remaining silver halide is sensitive, redeveloped, and fixed, the resulting silver image is bleached and re-halogenated thereby, and the re-halogenated silver image is treated to form a coloured complex image with said diazonium salt, pyrylium salt, and/or thiapyrylium salt.

11. A process according to claim 4, wherein the diazonium salt is derived from a p-diamine of the benzene series or from a p-arylaniline.

12. A process according to claim 4, wherein the diazonium salt is derived from p-phenylenediamine that is mono- or dialkyl-substituted on one of its amino groups or of which one of the amino groups makes part of a saturated heterocyclic ring.

13. A process according to claim 4, wherein the diazonium salt is used in an aqueous solution in a concentration of about $10^{-2}$ to about $10^{-1}$ mole per liter.

14. A process according to claim 4, wherein the pyrylium and thiapyrylium salt are used in dissolved state in a mixture of water and a water-miscible organic solvent improving the solubility in aqueous medium of said salt.

* * * * *